(12) United States Patent
Duan et al.

(10) Patent No.: US 9,909,030 B2
(45) Date of Patent: Mar. 6, 2018

(54) METHOD FOR PREPARING CARBON NANOTUBES GRAPHENE MODIFIED AQUEOUS POLYURETHANE COATINGS AND ADHESIVES

(71) Applicant: Yantai University, Yantai (CN)

(72) Inventors: Baorong Duan, Yantai (CN); Quanjie Wang, Yantai (CN); Zhihai Tang, Yantai (CN); Haiyan Ding, Yantai (CN); Mengmeng Zhang, Yantai (CN); Lijie Hou, Yantai (CN); Yanqing Wang, Yantai (CN); Guilin Liu, Yantai (CN); Shengxu Qian, Yantai (CN)

(73) Assignee: Yantai University, Yantai (CN)

( * ) Notice: Subject to any disclaimer, the term of this patent is extended or adjusted under 35 U.S.C. 154(b) by 0 days.

(21) Appl. No.: 15/141,483

(22) Filed: Apr. 28, 2016

(65) Prior Publication Data

US 2017/0114248 A1     Apr. 27, 2017

(30) Foreign Application Priority Data

Oct. 26, 2015  (CN) .......................... 2015 1 0699527

(51) Int. Cl.

| | | |
|---|---|---|
| *C09D 175/06* | (2006.01) | |
| *C09J 175/06* | (2006.01) | |
| *C23C 16/26* | (2006.01) | |
| *C08G 18/48* | (2006.01) | |
| *C08G 18/75* | (2006.01) | |
| *C08G 18/10* | (2006.01) | |
| *C08G 18/24* | (2006.01) | |
| *C09D 175/08* | (2006.01) | |
| *C08K 9/04* | (2006.01) | |

(52) U.S. Cl.

CPC ........... *C09D 175/06* (2013.01); *C08G 18/10* (2013.01); *C08G 18/246* (2013.01); *C08G 18/4854* (2013.01); *C08G 18/755* (2013.01); *C09D 175/08* (2013.01); *C09J 175/06* (2013.01); *C23C 16/26* (2013.01); *C08K 9/04* (2013.01); *C08K 2201/011* (2013.01)

(58) Field of Classification Search
CPC ........ C09D 175/06; C09J 175/06; C08K 9/04; C23C 16/26
See application file for complete search history.

(56) References Cited

FOREIGN PATENT DOCUMENTS

| CN | 101165127 A | * | 4/2008 | ........... C09D 175/04 |
|---|---|---|---|---|
| CN | 104277198 A | * | 1/2015 | ........... C09J 175/04 |
| CN | 104327717 A | * | 2/2015 | ........... C09D 175/04 |
| CN | 104449323 A | * | 3/2015 | ........... C09D 175/08 |
| JP | 2004168570 A | * | 6/2004 | |

* cited by examiner

*Primary Examiner* — Michael L Leonard
(74) *Attorney, Agent, or Firm* — Luoh J. Wu; Continent Patent Office LLP

(57) ABSTRACT

A method for preparing carbon nanotubes graphene modified aqueous polyurethane coatings and adhesives, which includes the steps of: (a) preparing carboxylated carbon nanotubes graphene nano-sheets; (b) mixing polytetrahydrofuran ether glycol with isophorone diisocyanate for reaction in the presence of dibutyltin dilaurate; and then adding 2-sulfobenzoic anhydride, carboxylated carbon nanotubes and graphene sheet into the mixture and allowing reaction under 90° C. for 2 hours to obtain a polyurethane prepolymer A; and (c) adding chain extender and acetone into the prepolymer A and allowing reaction under 65° C. to 75° C., adding D-panthenol and 2,4,6-trihydroxy benzoic acid and allowing reaction under 75° C. to 85° C. for 0.5 to 2 hours; then adding triethylamine and benzamide for neutralization and allowing reaction for 30~50 min; and finally adding water for emulsification to obtain carbon nanotubes graphene modified aqueous polyurethane coatings and adhesives, which is environment-friendly and can be used as adhesives on plastic, glass, paper-based materials and textiles.

6 Claims, No Drawings

METHOD FOR PREPARING CARBON NANOTUBES GRAPHENE MODIFIED AQUEOUS POLYURETHANE COATINGS AND ADHESIVES

CROSS REFERENCE TO RELATED APPLICATIONS

This application claims priority to China application Ser No Z1 201510699527.2 filed on Oct. 26, 2015.

Technical Field of the Invention

This invention relates to a method for preparing aqueous polyurethane coatings and adhesives, particularly, to a method for preparing carbon nanotubes graphene modified aqueous polyurethane coatings and adhesives Background of the Invention Polyurethane is mainly used in the fields of leather finishing, textile printing, paper-making industry, architectural coatings and adhesives, etc. Since the coatings and paintings that sprayed on inner side and outer side of the walls, furniture or surface of metal utensils are directly or indirectly contacted with human, poisonous and harmful coatings threatens people's health all the time. Furthermore, since application field of coatings and paintings often contact with sunlight, and sunlight contains a lot of ultraviolet light that is harmful to colored object, these harmful ultraviolet light with a wavelength of about 290 nm to 460 nm changes the colour of coatings through oxidation-reduction in chemistry.

It is common to use dibutyltin dilaurate as catalyst to polymerize polyurethane, but since heavy metal will make damages to the environment as the polyurethane degradating, how to fix catalyzed remnant stannum of dibutyltin dilaurate and reduce damage caused by polyurethane coatings residues to the environment has become a technical problem.

In order to improve the light resistance of polyurethane resin, the method of adding UV absorber and antioxidants is often used, but the conventional synthetic antioxidants such as tert butyl hydroxyanisole, hydrogen peroxide tertiary butyl and tert-butyl hydroquinone and so on have great toxic side effect and carcinogenicity, and effect of adding organosilicon material to improve the waterproof effect in conventional is not satisfactory, therefore it is necessary to seek high-efficient and environment-friendly water and light resistance measures.

Like most of other polymer materials, polyurethane is not heat-resisting, and is easy to be ignited, it produces toxic gases which endanger personal and property safety. The most common method for polyurethane product's resistance to flame is adding fire retardant; The commonly added fire retardants are phosphate and halogenated phosphate at present, such kind of fire retardant is not ideal for improving fire resistance effect of polyurethane.

SUMMARY OF THE INVENTION

The technical problems to be solved by the present invention is to provide a method for preparing carbon nanotubes graphene modified aqueous polyurethane coatings and adhesives, the aqueous polyurethane coatings are modified by carbon nanotubes graphene, thereby improving the fire resistance and light resistance of aqueous polyurethane, and reducing the toxicity of polyurethane.

A method for preparing carbon nanotubes graphene modified aqueous polyurethane coatings and adhesives, wherein:

(1) preparing carboxylated carbon nanotubes graphene nano-sheet: certain amount of carbon nanotubes, graphene sheets, 4-boric acid triphenylamine and 3,4,5-trifluorophenyl boronic acid are added into proton acid and mixed respectively, the reaction temperature is 60° C. to 80° C., after being condensed and refluxed in an ultrasonic cleaner with 400 W power and 80 KHz frequency for 2 to 5 hours, the mixture is diluted with 350 ml of deionized water, then the mixture is pumping filtered, and washed repeatedly with deionized water until it is neutral, finally, the mixture is dried up at 80° C., and grinded to fine powders, eventually, carboxylated carbon nanotubes graphene sheets are obtained;

wherein, amount of graphene sheet added into each 100 mL of proton acid is 0.2 g, amount of carbon nanotubes added into each 100 mL of proton acid is 0.1 g; added amount of 4-boric acid triphenylamine and 3,4,5-trifluorophenylboronic acid is 300% and 200% of carbon nanotubes by weight respectively;

(2) preparing polyurethane prepolymer A: polytetrahydrofuran ether glycol is mixed with isophorone diisocyanate at a weight ratio of 1:1 to 4:1, dibutyltin dilaurate catalyst is added, and reacting for 2 to 3 hours at a temperature of 60° C. to 80° C., 2-sulfobenzoic anhydride and carboxylated carbon nanotubes graphene sheet prepared in step (1) are added, and reacting for 2 hours at 90° C., then polyurethane prepolymer A is obtained; amount of said catalyst is 0.1% to 0.4% of total weight of polytetrahydrofuran ether glycol and isophorone diisocyanate, amount of 2-sulfobenzoic anhydride is 0.2% to 0.4% of total weight of polytetrahydrofuran ether glycol, isophorone diisocyanate and dibutyltin dilaurate; amount of carboxylated carbon nanotubes graphene sheet is 0.05% of total weight of polytetrahydrofuran ether glycol, isophorone diisocyanate and dibutyltin dilaurate;

(3) preparing aqueous polyurethane coatings and adhesives: chain extender having 1.5% to 3.5% of the weight of prepolymer A and acetone having 18% to 30% of the weight of prepolymer A are added into prepolymer A prepared in step (2) and reacting for 1.8 to 3.2 hours at 65° C. to 75° C., D-panthenol having 0.5% to 1.2% of the weight of prepolymer A and 2,4,6-trihydroxy benzoic acid having 0.8% to 2.0% of the weight of prepolymer A are added respectively, reacting at 75° C. to 85° C. for 0.5 to 2 hours, triethylamine having 12% to 15% of the weight of prepolymer A and benzamide having 1% of the weight of prepolymer A are added for neutralization and reacting for 30 to 50 min, water is added for emulsification, and then aqueous polyurethane coatings and adhesives are obtained. Said graphene sheet is the graphene sheet that produced by a method of chemical vapor deposition and has a length of 0.1 μm to 10 μm, a width of 0.1 μm to 10 μm, a thickness of 1 nm to 10 nm, a purity of 99.5 (wt.)%, and a specific surface area of 500 m2/g to 2600 m2/g. Said proton acid is one of concentrated nitric acid and concentrated sulfuric acid.

Said carbon nanotubes are single-walled carbon nanotubes having a diameter between 0.8 nm and 1.6 nm and an average diameter of 1 nm, a length between 5 μm and 30 μm. The molecular weight of polytetrahydrofuran ether glycol is 500. Chain extender is any one of sulfanilamide, chlorothiazide, salicylamide, N-methyl acetamide, methacrylamide or N,N-dimethylacrylamide.

The present invention has the following characteristics:

in the present invention, under the catalysis of dibutyltin dilaurate, polytetrahydrofuran ether glycol is reacted with isophorone diisocyanate, dibutyltin dilaurate is fixed by 2-sulfobenzoic anhydride, D-panthenol and 2,4,6-trihydroxy benzoic acid are reacted with residual isocyanate, thereby improving fire resistance and light resistance of polyurethane. They are embodied specifically in the following aspects:

(1) 2-sulfobenzoic anhydride fixes the catalyst, thereby reducing the toxicity of polyurethane, while cyclophosphamide can play a mutual synergistic effect with sorbitol, thereby improving light resistance of polyurethane;
(2) D-panthenol and 2,4,6-trihydroxy benzoic acid are reacted with residual isocyanate, meanwhile further improving fire resistance of polyurethane due to rich carbon content of D-panthenol and 2,4,6-trihydroxy benzoic acid;
(3) carboxylated carbon nanotubes and graphene are reacted with isocyanate, and are grafted to the polyurethane prepolymer;
(4) 4-boric acid triphenylamine and 3,4,5-trifluorophenylboronic acid can enhance the carboxylation degree of carbon nano and graphene;
(5) Benzamide enhances the neutralization effect of triethylamine;
(6) to select the components of carboxylated carbon nanotubes, graphene, D-panthenol and 2,4,6-trihydroxy benzoic acid and etc is benefit to improve fire resistance of coatings and adhesives.

DETAILED DESCRIPTION OF SPECIFIC EMBODIMENT

The present invention will be further illustrated in combination with the embodiments.

Embodiment 1

(1) Preparing carboxylated carbon nanotubes graphene nano-sheet 0.1 g of carbon nanotubes, 0.2 g sheet of graphene are added into 300 ml of concentrated sulfuric acid, 0.3 g of 4-boric acid triphenylamine and 0.2 g of 3,4,5-trifluorophenylboronic acid and mixing, the reaction temperature is 60° C., the mixture is condensed and refluxed in an ultrasonic cleaner with 400 W power and 80 KHz frequency for 2 to 5 hours, and is diluted with 350 ml of deionized water after untrasonic treatment, then it is pumping filtered with microporous membrane having a diameter of 0.2 μm, it is washed repeatedly with deionized water until it is neutral, finally it is dried for 12 hours at 80° C. and grinded to fine powder, and carboxylated carbon nanotubes graphene nano-sheet is obtained. Graphene is graphene sheet produced by a method of chemical vapor deposition having a length of 0.1 μm to 10 μm, a width of 0.1 μm to 10 μm, a thickness of 1 nm to 10 nm, a purity of 99.5 (wt.)%, and a specific surface area of 500 m2/g to 2600 m2/g. Carbon nanotubes are single-walled carbon nanotubes having a diameter between 0.8 nm and 1.6 nm and an average diameter of 1 nm, a length between 5 μm and 30 μm;

(2) 1 g of dibutyltin dilaurate catalyst, 50 g of polytetrahydrofuran ether glycol and 50 g of isophorone diisocyanate are added into a 500 ml four-necked flask equipped with stirring blade, thermometer, condenser pipe and reacted for 2 hours at a temperature of 60° C., 0.2 g of 2-sulfobenzoic anhydride and 0.05 g of carboxylated carbon nanotubes and graphene sheet prepared in step (1) are added and reacting for 2 hours at 90° C., then 100 g of polyurethane prepolymer A is obtained, the molecular weight of said polytetrahydrofuran ether glycol is 500;

(3) 1.5 g of sulfanilamide and 18 g of acetone are added into prepolymer A, and reacted for 1.8 hours at a temperature of 65° C., 0.5 g of D-panthenol and 0.8 g of 2,4-trihydroxy benzoic acid are added, the reaction temperature is 75° C. and the reaction time is 0.5 hours, 12 g of triethylamine and 1 g of benzamide are added for neutralization and reacting for 30 min, 120 g of water is added and stirred for emulsification, then aqueous polyurethane coatings and adhesives are obtained.

Embodiment 2

(1) Preparing carboxylated carbon nanotubes graphene nano-sheet 0.1 g of carbon nanotubes, 0.2 g sheet of graphene are added into 300 ml of concentrated nitric acid, 0.3 g of 4-boric acid triphenylamine and 0.2 g of 3,4,5-trifluorophenylboronic acid and mixed, the reaction temperature is 80° C., the mixture is condensed and refluxed in an ultrasonic cleaner with 400 W power and 80 KHz frequency for 5 hours, and are diluted with 350 ml of deionized water after untrasonic treatment, then it is pumping filtered with microporous membrane having a diameter of 0.2 μm, it is washed with deionized water until it is neutral, finally it is dried for 12 hours at a temperature of 80° C. and grinded to fine powder, and carboxylated carbon nanotubes graphene nano-sheet is obtained. Graphene is graphene sheet produced by a method of chemical vapor deposition having a length of 0.1 μm to 10 μm, a width of 0.1 μm to 10 μm, a thickness of 1 nm to 10 nm, a purity of 99.5 (wt.)%, and a specific surface area of 500 m2/g to 2600 m2/g. Said carbon nanotubes are single-walled carbon nanotubes having a diameter between 0.8 nm and 1.6 nm, an average diameter of 1 nm, a length between 5 um and 30 um;

(2) 0.6 g of dibutyltin dilaurate, 120 g of polytetrahydrofuran ether glycol and 30 g of isophorone diisocyanate are mixed in a 500 ml four-necked flask equipped with stirring blade, thermometer, condenser pipe, reacted for 3 hours at a temperature of 80° C., 0.6 g of 2-sulfobenzoic anhydride and 0.75 g of carboxylated carbon nanotubes and graphene sheet prepared in step (1) are added, the reaction time is 2 hours, the reaction temperature is 90° C., then 100 g of polyurethane prepolymer A is obtained, the molecular weight of polytetrahydrofuran ether glycol is 500;

(3) 5.25 g of methacrylamide and 45 g of acetone are added into prepolymer A, and reacted for 3.2 hours at a temperature of 75° C., 1.8 g of D-panthenol and 3 g of 2,4,6-trihydroxy benzoic acid are added, the reaction temperature is 85° C., the reaction time is 2 hours, 22.5 g of triethylamine and 1.5 g of benzamide are added for neutralization and reacted for 350 min, 100 g of water is added for emulsification, and aqueous polyurethane coatings and adhesives are obtained.

Embodiment 3

(1) Preparing carboxylated carbon nanotubes graphene nano-sheet 0.1 g of carbon nanotubes, 0.2 g sheet of graphene are added into 300 ml of concentrated nitric acid, 0.3 g of 4-boric acid triphenylamine and 0.2 g of 3,4,5-trifluorophenylboronic acid and mixed, the reaction temperature is 70° C. The mixture is condensed and refluxed in an ultrasonic cleaner with 400 W power and 80 KHz frequency for 3.5 hours, and are diluted with 350 ml of deionized water after untrasonic treatment, then it is pumping filtered with microporous membrane having a diameter of 0.2 μm, then it is washed repeatedly with deionized water until it is neutral, finally it is dried for 12 hours at a temperature of 80° C. and grinded to fine powder, and carboxylated carbon nanotubes graphene nano-sheet is obtained. Graphene is graphene sheet produced by a method of chemical vapor deposition having a length of 0.1 μm to 10 μm, a width of 0.1 μm to 10 μm, a thickness of 1 nm to 10 nm, a purity of 99.5 (wt.)%, and a specific surface area of 500 m2/g to 2600 m2/g. Said carbon nanotubes are single-walled carbon nanotubes having a diameter of 0.8 nm to 1.6 nm, an average diameter of 1 nm, a length of 5 um to 30 um;

(2) 0.3 g of dibutyltin dilaurate, 75 g of polytetrahydrofuran ether glycol and 30 g of isophorone diisocyanate are added into a 500 ml four-necked flask equipped with stirring blade, thermometer, condenser pipe and reacted for 2.5 hours at a temperature of 70° C., 0.3 g of 2-sulfobenzoic anhydride and 0.05 g of carboxylated carbon nanotubes and graphene sheet prepared in step (1) are added, the reaction time is 2 hours, the reaction temperature is 90° C., then 105 g of polyurethane prepolymer A is obtained, the molecular weight of polytetrahydrofuran ether glycol is 500;

(3) 2.6 g of salicylamide and 25.2 g of acetone are added into prepolymer A and reacted for 2.5 hours at a temperature of 70° C., 0.9 g of D-panthenol and 1.5 g of 2,4,6-trihydroxy benzoic acid are added, the reaction temperature is 80° C., the reaction time is 1.25 hours, 14.2 g of triethylamine and 1 g of benzamide are added for neutralization and reacted for 40 min, 110 g of water is added for emulsification, and aqueous polyurethane coatings and adhesives are obtained.

Embodiment 4

(1). Preparing carboxylated carbon nanotubes graphene nano-sheet
0.1 g of carbon nanotubes, 0.2 g sheet of graphene are added into 300 ml of concentrated sulfuric acid, 0.3 g of 4-boric acid triphenylamines and 0.2 g of 3,4,5-trifluorophenylboronic acid and mixed, the reaction temperature is 60° C., the mixture is condensed and refluxed in an ultrasonic cleaner with 400 W power and 80 KHz frequency for 2 to 5 hours, and are diluted with 350 ml of deionized water after untrasonic treatment then it is pumping filtered with microporous membrane having a diameter of 0.2 μm and washed repeatedly with deionized water until it is neutral, finally it is dried for 12 hours at a temperature of 80° C. and grinded to fine powder, and carboxylated carbon nanotubes graphene nano-sheet are obtained. Graphene is graphene sheet produced by a method of chemical vapor deposition having a length of 0.1 μm to 10 μm, a width of 0.1 μm to 10 μm, a thickness of 1 nm to 10 nm, a purity of 99.5 (wt.)%, and a specific surface area of 500 m2/g to 2600 m2/g; carbon nanotubes are single-walled carbon nanotubes having a diameter of 0.8 nm to 1.6 nm, an average diameter of 1 nm, a length of 5 um to 30 um;

(2) 1 g of dibutyltin dilaurate catalyst, 50 g of polytetrahydrofuran ether glycol and 50 g of isophorone diisocyanate are added into a 500 ml four-necked flask equipped with stirring blade, thermometer, condenser pipe, and reacted for 2 hours at a temperature of 60° C., 0.2 g of 2-sulfobenzoic anhydride and 0.05 g of carboxylated carbon nanotubes and graphene sheet prepared in step (1) are added, the reaction time is 2 hours, the reaction temperature is 90° C., then 100 g of polyurethane prepolymer A is obtained, the molecular weight of said polytetrahydrofuran ether glycol is 500;

(3) 1.5 g of methacrylamide and 18 g of acetone are added into prepolymer A, and reacted for 1.8 hours at a temperature of 65° C., 0.5 g of D-panthenol and 0.8 g of 2,4,6-trihydroxy benzoic acid are added, the reaction temperature is 75° C. and the reaction time is 0.5 hours, 12 g of triethylamine and 1 g of benzamide are added for neutralization and reacted for 30 min, 120 g of water is added and stirred for emulsification, and aqueous polyurethane coatings and adhesives are obtained.

Embodiment 5

(1) Preparing carboxylic carbon nanotubes graphene nano-sheet
0.1 g of carbon nanotubes, 0.2 g sheet of graphene are added into 300 ml of concentrated nitric acid, 0.3 g of 4-boric acid triphenylamine and 0.2 g of 3,4,5-trifluorophenylboronic acid and mixed, the reaction temperature is 80° C., the mixture is condensed and refluxed in an ultrasonic cleaner with 400 W power and 80 KHz frequency for 5 hours and are diluted with 350 ml of deionized water after untrasonic treatment, then it is pumping filtered with microporous membrane having a diameter of 0.2 μm and washed repeatedly with deionized water until it is neutral and finally it is dried for 12 hours at a temperature of 80° C. and grinded to fine powder, and carboxylated carbon nanotubes graphene nano-sheet are obtained. Graphene is graphene sheet produced by a method of chemical vapor deposition having a length of 0.1 μm to 10 μm, a width of 0.1 μm to 10 μm, a thickness of 1 nm to 10 nm, a purity of 99.5 (wt.)%, and a specific surface area of 500 m2/g to 2600 m2/g;

(2) 0.6 g of dibutyltin dilaurate, 120 g of polytetrahydrofuran ether glycol and 30 g of isophorone diisocyanate are mixed in a 500 ml four-necked flask equipped with stirring blade, thermometer, condenser pipe and reacted for 3 hours at a temperature of 80° C., 0.6 g of 2-sulfobenzoic anhydride and 0.75 g of carboxylated carbon nanotubes and graphene sheet prepared in step (1) are added, the reaction time is 2 hours, the reaction temperature is 90° C., then 150 g of polyurethane prepolymer A is obtained;

(3) 5.25 g of N,N-dimethylacrylamide and 45 g of acetone are added into prepolymer A and reacted for 3.2 hours at a temperature of 75° C., 1.8 g of D-panthenol and 3 g of 2,4,6-trihydroxy benzoic acid are added, the reaction temperature is 85° C., the reaction time is 2 hours, 22.5 g of triethylamine and 1.5 g of benzamide are added for neutralization and reacted for 350 min, 100 g of water is added for emulsification, then aqueous polyurethane coatings and adhesives are obtained.

D-panthenol is purchased from Wuhan Dahua Weiye Chemical Co., Ltd., chemical raw materials having the same kind of name (such as carbon nanotubes) used by the invention can be purchased from any production or marketing businesses.

The beneficial effects of the present invention will be illustrated further by the related experimental data below.

In order to quantificationally describe the light resistance performance of the coatings, it is detected by spectrophotometer to obtain anti-color value Δ E, so as to describe the light resistance of coatings and finishing coat. Δ E represents the degree of the color change, a larger Δ E represents a more pronounced change of color. Generally speaking, Δ E value in the range of 0 to 1.5 belongs to slight variation; Δ E value in the range of 1.5 to 3.0 belongs to sensible variation; ΔE value in the range of 3.0 to 6.0 belongs to obvious variation.

[Reference to: Fang Wang, Gaochao Dang, Liqin Wang, Light Degradation of Several Kinds of Organic Heritage Protection Polymer Coatings [J]. Journal of Northwest University, 2005, 35 (5): 56~58), PU-1 is polyurethane anti-corrosive paint selected from Wuxi City Botao Chemical Co., Ltd].

TABLE 1

Light resistance of carbon nanotubes and graphene modified light resistent and fire resistent aqueous polyurethane formed film:

| Time/min | Embodiment 1 | Embodiment 2 | Embodiment 3 | Embodiment 4 | Embodiment 5 | Marketed PU-1 |
|---|---|---|---|---|---|---|
| 90 | 0.3 | 0.2 | 0.4 | 0.2 | 0.1 | 0.3 |
| 150 | 0.7 | 0.5 | 0.3 | 0.3 | 0.2 | 0.4 |
| 270 | 0.9 | 0.5 | 0.5 | 0.3 | 0.2 | 0.5 |
| 330 | 0.9 | 0.6 | 0.6 | 0.4 | 0.3 | 0.8 |
| 390 | 1.0 | 0.9 | 0.8 | 0.8 | 0.3 | 1.0 |
| 450 | 1.1 | 0.9 | 0.8 | 0.8 | 0.3 | 1.2 |
| 510 | 1.1 | 1.2 | 0.9 | 0.9 | 0.6 | 1.8 |
| 540 | 11 | 1.2 | 1.0 | 1.0 | 0.9 | 2.0 |
| 600 | 1.1 | 1.2 | 1.2 | 1.2 | 0.9 | 2.5 |

It can be seen from table 1 that light resistance of coatings prepared in Embodiment 1 to Embodiment 5 are all under the scope of slight variation, and exhibits good light resistance, the marketed PU-1 is under 510 min which belongs to sensible variation. Fire resistance is measured by smoke density method (maximum smoke density, time to reach maximum smoke density), oxygen index, vertical combustion index (with flame combustion time, without flame combustion time).

Table 2 Light resistance of carbon nanotubes and graphene modified light resistant and fire resistant aqueous polyurethane formed film:

TABLE 2

The detection standards of each index are as follows respectively: smoke density is measured according to GB8323-2008, oxygen index is measured using GB/T5454-1997"Textiles Combustion performance test-Oxygen index method"; with flame combustion time and without flame combustion time are measured according to GB/T 5455-1997"Textiles Combustion performance test-vertical method".

|  | Embodiment 1 | Embodiment 2 | Embodiment 3 | Embodiment 4 | Embodiment 5 | Marketed PU-1 |
|---|---|---|---|---|---|---|
| Maximum smoke density | 45 | 40 | 34 | 38 | 32 | 68 |
| Time to reach maximum smoke density/s | 160 | 160 | 185 | 160 | 160 | 120 |
| Oxygen index | 24.3 | 26.2 | 26.3 | 25.4 | 25.3 | 21 |
| With flame combustion time/s | 36.4 | 25.5 | 11.4 | 23.8 | 16.3 | 39 |
| Without flame combustion time/s | 0 | 0 | 0 | 0 | 0 | 15 |

As can be seen from the tables, the maximum smoke density is substantially reduced whereas the time to that is substantially prolonged, the oxygen index is obviously improved, and the combustion time is substantially shortened as the carbon nanotubes and graphene modified light resistant and fire resistant aqueous polyurethane of the present invention are employed.

What is claimed is:

1. A method for preparing carbon nanotubes graphene modified aqueous polyurethane coatings and adhesives, comprising the steps of:
    (a) preparing carboxylated carbon nanotubes graphene nano-sheets, which comprises the steps of: adding carbon nanotubes, graphene sheets, 4-boronic acid triphenylamine and 3,4,5-trifluorophenyl boronic acid into proton acid respectively and mixing to form a mixture; allowing reaction under a temperature of 60° C. to 80° C.; then condensing and refluxing the mixture in an ultrasonic cleaner with 400 W power and 80 KHz frequency for 2 to 5 hours; diluting the mixture with 350 ml of deionized water; then carrying out pumping, filtering and washing repeatedly with deionized water until the mixture is neutral; drying the mixture under 80° C. and grinding into fine powders to obtain carboxylated carbon nanotubes graphene nano-sheets;
    wherein an amount of the graphene sheets added for each 100 mL of the proton acid is 0.2 g, an amount of the carbon nanotubes added for each 100 mL of the proton acid is 0.1 g; an added amount of the 4-boric acid triphenylamine and the 3,4,5-trifluorophenylboronic acid are 300% and 200% of the carbon nanotubes by weight respectively;
    (b) preparing polyurethane prepolymer A, which comprises the steps of: mixing polytetrahydrofuran ether glycol with isophorone diisocyanate at a weight ratio of 1:1 to 4:1, adding a catalyst of dibutyltin dilaurate; allowing reaction for 2 to 3 hours at a temperature of 60° C. to 80° C.; then adding 2-sulfobenzoic anhydride and the carboxylated carbon nanotubes graphene sheet prepared in step (a) and allowing reaction for 2 hours at 90° C. to obtain polyurethane prepolymer A;
    wherein an amount of the catalyst is 0.1% to 0.4% of total weight of the polytetrahydrofuran ether glycol and the isophorone diisocyanate, an amount of the 2-sulfobenzoic anhydride is 0.2% to 0.4% of total weight of the polytetrahydrofuran ether glycol, the isophorone diisocyanate and the dibutyltin dilaurate; an amount of the carboxylated carbon nanotubes graphene sheet is 0.05% of total weight of the polytetrahydrofuran ether glycol, the isophorone diisocyanate and the dibutyltin dilaurate;
    (c) preparing aqueous polyurethane coatings and adhesives, comprising the steps of: adding chain extender having 1.5% to 3.5% of the weight of prepolymer A and acetone having 18% to 30% of the weight of prepolymer A into prepolymer A prepared in step (b) and allowing reaction for 1.8 to 3.2 hours at 65° C. to 75° C., then adding D-panthenol having 0.5% to 1.2% of the weight of prepolymer A and 2,4,6-trihydroxy benzoic acid having 0.8% to 2.0% of the weight of prepolymer A respectively and allowing reaction at 75° C. to 85° C. for 0.5 to 2 hours, then adding triethylamine having 12% to 15% of the weight of prepolymer A and benzamide having 1% of the weight of prepolymer A for neutralization and allowing reaction for 30 to 50 minutes, then adding water for emulsification to obtain aqueous polyurethane coatings and adhesives.

2. The method for preparing carbon nanotubes graphene modified aqueous polyurethane coatings and adhesives according to claim 1, wherein the graphene sheet is a graphene sheet produced by a method of chemical vapor deposition and has a length of 0.1 μm to 10 μm, a width of 0.1 μm to 10 μm, a thickness of 1 nm to 10 nm, a purity of 99.5 (wt.)%, and a specific surface area of 500 m2/g to 2600 m2/g.

3. The method for preparing carbon nanotubes graphene modified aqueous polyurethane coatings and adhesives according to claim 1, wherein the proton acid is selected from the group consisting of concentrated nitric acid and concentrated sulfuric acid.

4. The method for preparing carbon nanotubes graphene modified aqueous polyurethane coatings and adhesives according to claim 1, wherein the carbon nanotubes are single-walled carbon nanotubes, each of the single-walled carbon nanotube has a diameter between 0.8 nm and 1.6 nm and a length between 5 um and 30 um, wherein the single-walled carbon nanotubes have an average diameter of 1 nm.

5. The method for preparing carbon nanotubes graphene modified aqueous polyurethane coatings and adhesives according to claim 1, wherein a molecular weight of the polytetrahydrofuran ether glycol is 500.

6. The method for preparing carbon nanotubes graphene modified aqueous polyurethane coatings and adhesives according to claim 1, wherein the chain extender is selected from the group consisting of sulfanilamide, chlorothiazide, salicylamide, N-methyl acetamide, methacrylamide and N,N-dimethylacrylamide.

* * * * *